United States Patent
Straeussnigg et al.

(10) Patent No.: US 10,797,715 B2
(45) Date of Patent: Oct. 6, 2020

(54) FILTERING METHOD AND FILTER

(71) Applicant: Infineon Technologies AG, Neubiberg (DE)

(72) Inventors: Dietmar Straeussnigg, Villach (AT); Reinhard Kussian, Klagenfurt (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/663,957

(22) Filed: Oct. 25, 2019

(65) Prior Publication Data
US 2020/0162087 A1 May 21, 2020

(30) Foreign Application Priority Data
Nov. 19, 2018 (DE) .................. 10 2018 129 062

(51) Int. Cl.
| | | |
|---|---|---|
| H03M 1/00 | (2006.01) | |
| H03M 1/06 | (2006.01) | |
| H03M 1/12 | (2006.01) | |
| H03M 1/10 | (2006.01) | |
| G11C 27/02 | (2006.01) | |

(52) U.S. Cl.
CPC ......... *H03M 1/0626* (2013.01); *H03M 1/129* (2013.01); *H03M 1/1245* (2013.01); *G11C 27/02* (2013.01); *H03M 1/1009* (2013.01); *H03M 1/12* (2013.01)

(58) Field of Classification Search
CPC ........ H03M 1/12; H03M 1/1009; G11C 27/02
USPC ................................. 341/126, 122, 120, 155
See application file for complete search history.

(56) References Cited

U.S. PATENT DOCUMENTS

| | | | |
|---|---|---|---|
| 4,509,037 A | 4/1985 | Harris | |
| 5,561,660 A | 10/1996 | Kotowski et al. | |
| 5,841,310 A * | 11/1998 | Kalthoff ............... | G06G 7/1865 |
| | | | 327/337 |
| 6,147,633 A | 11/2000 | Ukawa et al. | |
| 7,102,548 B1 | 9/2006 | Wang et al. | |
| 7,265,702 B1 | 9/2007 | Wu et al. | |
| 9,685,967 B1 | 6/2017 | Motz et al. | |
| 9,837,990 B1 | 12/2017 | Pagnanelli | |
| 2007/0153946 A1 | 7/2007 | Sturza | |

(Continued)

FOREIGN PATENT DOCUMENTS

| | | |
|---|---|---|
| DE | 102010040377 A1 | 3/2012 |
| WO | 03039006 A2 | 5/2003 |
| WO | 2016201216 A1 | 12/2016 |

*Primary Examiner* — Joseph J Lauture
(74) *Attorney, Agent, or Firm* — Slater Matsil, LLP (57) ABSTRACT

A filtering method and a filter are disclosed. The method includes integrating values of an input signal by an integrator comprising a memory; storing an integration value in the memory; cyclically resetting the memory after integrating a first predefined number of values of the input signal; in a steady operating mode, generating a value of an output signal based on the integration value stored in the memory each time after integrating the first predefined number of values of the input signal; and in an initial operating mode, generating an initial value of the output signal based on the integration value stored in the memory after integrating a second predefined number of values of the input signal, wherein the second predefined number is smaller than the first predefined number.

20 Claims, 8 Drawing Sheets

(56) References Cited

U.S. PATENT DOCUMENTS

2009/0267650 A1  10/2009  Lee
2018/0159510 A1  6/2018  Lamb et al.

\* cited by examiner

FIG 9

FILTERING METHOD AND FILTER

This application claims the benefit of German Application No. 102018129062.4, filed on Nov. 19, 2018, which application is hereby incorporated herein by reference in its entirety.

TECHNICAL FIELD

This disclosure relates in general to a signal filtering method and a filter.

BACKGROUND

Low-pass filtering a signal may include calculating an average of several successive signal values of the signal. Calculating the average may include integrating a predefined number of successive signal values of an input signal and, per each sequence of the predefined number of successive signal values, generating one output signal value representing the result of the integration. In this method, however, there is a delay at the beginning of the filtering process because a first output signal value is not generated before the predefined number of successive signal values of the input signal has been integrated.

There is a need for an improved low-pass filtering method, in particular, a low-pass filtering method with a reduced delay at the beginning of the filtering process.

SUMMARY

One example relates to a method. The method includes integrating values of an input signal by an integrator including a storing means, storing an integration value in the storing means, and cyclically resetting the storing means after integrating a first predefined number of values of the input signal. The method further includes, in a steady operating mode, generating a value of an output signal based on the integration value stored in the storing means each time after integrating the first predefined number of values of the input signal, and, in an initial operating mode, generating an initial value of the output signal based on a respective integration value stored in the storing means after integrating a second predefined number of values of the input signal, wherein the second predefined number is smaller than the first predefined number.

Another example relates to a filter. The filter includes an integrator, a reset circuit, and an output circuit. The integrator includes a storing means and is configured to successively integrate values of an input signal and store an integration value in the storing means. The reset circuit is configured to reset the storing means after integrating a first predefined number of values of the input signal. The output circuit is coupled to the storing means and is configured, in a steady operating mode, to generate a value of an output signal based on the integration value stored in the storing means each time after integrating the first predefined number of values of the input signal, and in an initial operating mode, to generate an initial value of the output signal based on a respective integration value stored in the storing means after integrating a second predefined number of values of the input signal, wherein the second predefined number is smaller than the first predefined number.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
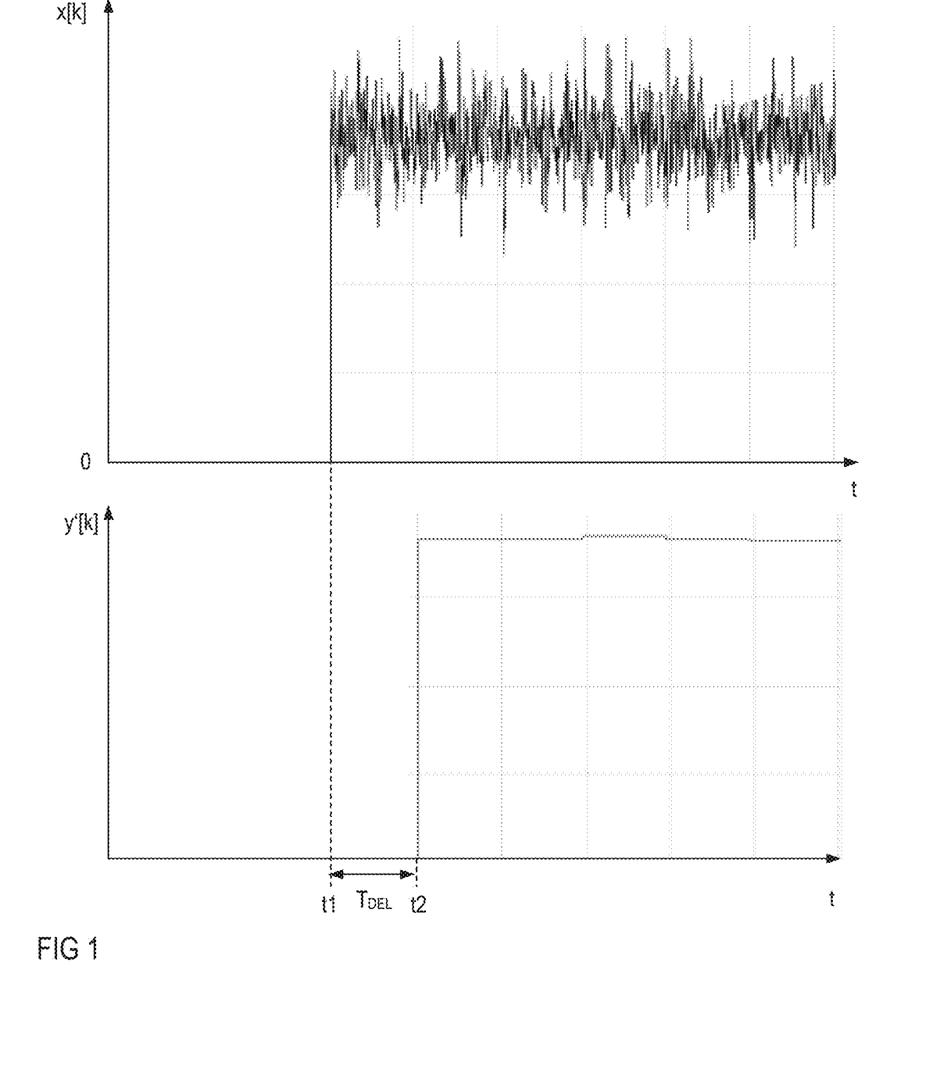
FIG. 1 shows signal waveforms that illustrate one example of a conventional method for low-pass filtering a signal.

FIG. 1 shows signal waveforms that illustrate one example of a conventional method for low-pass filtering a discrete input signal x[k]. The conventional low-pass filtering method includes, for each of a plurality of sequences that each include a predefined number of successive values of the input signal x[k], integrating the values of each sequence in order to obtain a respective integration value. The method further includes generating an output signal y'[k] based on the integration values such that the integration value obtained based on one sequence forms one output value of the output signal y'[k] until a new integration value based on a successive sequence has been obtained. This method, however, results in a time delay between a first time instance when a first signal value of the input signal x[k] is received and a second time instance when a first signal value of the output signal y'[k] is provided. This is explained in the following.

Referring to FIG. 1, the input signal x[k] may start at the first time instance t1, which is the time instance when a first value x[1] of the input signal is received by a filter (not shown in FIG. 1) performing the filtering method. A first value of the output signal y'[k] is output at a second time instance t2 after the predefined number N1 of successive values of the input signal x[k] have been integrated. A delay time $T_{DEL}$ between the first time instance t1 and the second time instance t2 is given by $T_{DEL}=(N1-1)\, T_{CLK}=(N1-1)/f_{CLK}$, where N1 is the predefined number and $T_{CLK}=1/f_{CLK}$ is the sampling period, that is, the reciprocal of the sampling frequency of the input signal x[k].

Depending on the predefined number N1 of signal values that are integrated and the sampling frequency $f_{CLK}$ of the input signal x[k], corresponding to the desired performance, the delay time $T_{DEL}$ may be in the range of 1 ms to 100 ms, for example. The sampling frequency may be between 1 kHz and 10 kHz, for example, and the predefined number N1 may be selected from between 100 and 2000, for example. In many applications, however, a delay time in this range is not acceptable. There is therefore a need for a method for low-pass filtering an input signal that has a reduced delay between a start of the input signal x[k] and a time instance when a first value of the output signal is provided.

Figure 2:
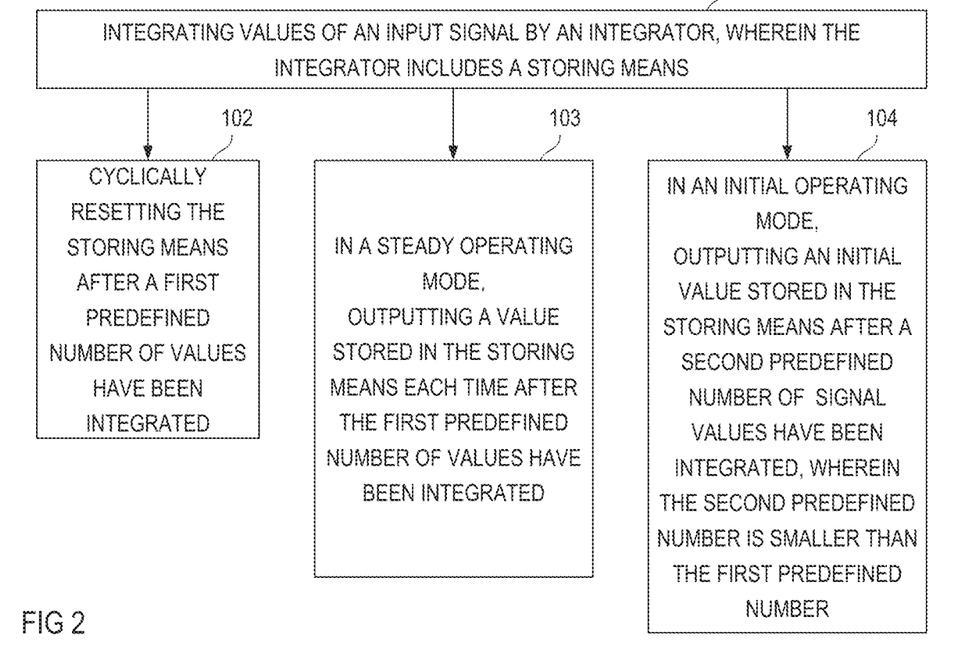
FIG. 2 shows a flowchart that illustrates one example of an improved low-pass filtering method.

FIG. 2 illustrates a block diagram of one example of a method for low-pass filtering an input signal and providing a first value of an output signal with a reduced delay time. The method includes integrating values of an input signal by an integrator that includes a storing means (101), and cyclically resetting the storing means after a first predefined number of values of the input signal have been integrated (102). The "values of the input signal" are also referred to as input signal values in the following. Referring to FIG. 2, the method further includes, in a steady operating mode, outputting a value stored in the storing means each time after the first predefined number of input signal values have been integrated (103). Thus, in the steady operating mode, a new value is output each time the input signal values of a sequence including the predefined number of input signal values have been integrated. Per each sequence of input signal values, the value stored in the storing means at the end of the integration process may be output once. According to another example, the same value is output several times until the signal values of a next sequence of input signal values have been integrated.

Referring to FIG. 2, the method further includes, in an initial operating mode, outputting an initial value stored in the storing means after a second predefined number of signal values have been integrated and before the first predefined number of input signal values have been integrated (104). By this, a delay time between a time instance at which a first value of the input signal is received by the integrator and a time instance at which a first value is output can be reduced. In particular, the delay time is shorter than the first predefined number minus one (N1−1) multiplied with the reciprocal of the sampling frequency $f_{CLK}$, that is, $T_{DEL} <$ (N1−1)/$f_{CLK}$. This is explained in further detail below. In the following, the first predefined number N1 is simply referred to as predefined number.

Figure 3:
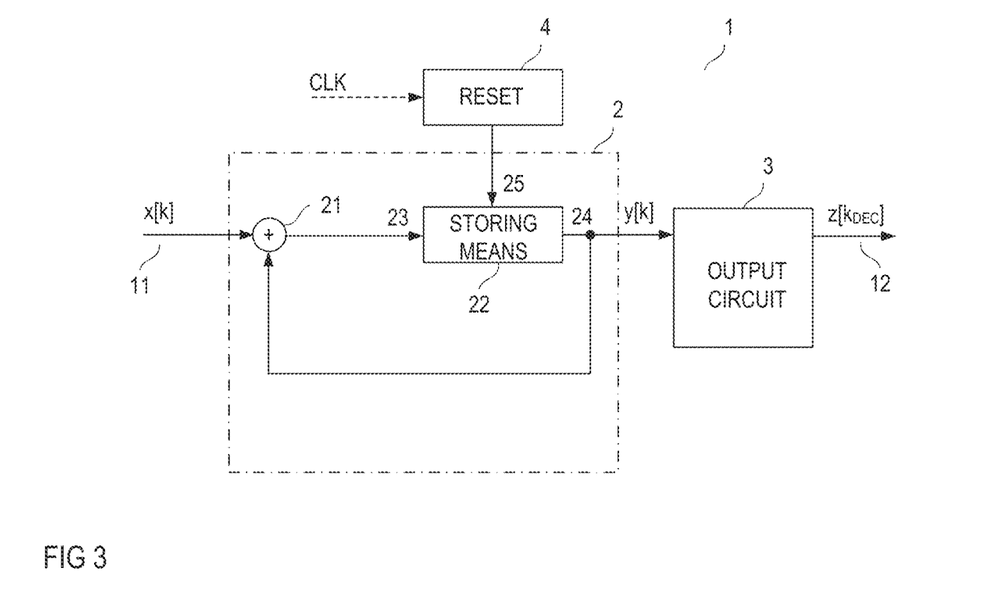
FIG. 3 illustrates one example of a filter capable of implementing the method illustrated in FIG. 2.

FIG. 3 illustrates one example of a filter 1 that is configured to perform the method illustrated with reference to FIG. 2. Referring to FIG. 3, the filter 1 includes an input 11 configured to receive the input signal x[k] and an output 12 configured to output an output signal $z[k_{DEC}]$ based on low-pass filtering the input signal x[k]. As will be explained in further detail herein below, the output signal $z[k_{DEC}]$ has a lower sampling frequency than the input signal x[k] so that the input signal x[k] and the output signal $z[k_{DEC}]$ have different discrete time variables k and $k_{DEC}$.

The filter 1 further includes an integrator 2 connected to the input 11, an output circuit 3 downstream the integrator 2 and connected to the output 12, and a reset circuit 4 connected to the integrator 2. The integrator 2 comprises a storing means 22 and is configured to integrate (sum up) successive values of the input signal x[k] and store a new integration value y[k] in the storing means 22 each time a new value of the input signal x[k] is received. The integration value y[k] is available at an output 24 of the storing means 22, that is, an output signal of the integrator 2 represents a sequence of integration values y[k] stored in the storing means 22. In the following, x[k] is used to denote both, the input signal and values of the input signal. Equivalently, y[k] is used to denote both, the output signal y[k] of the integrator 2 and the integration values.

It should be noted that the block diagram of the filter 1 shown in FIG. 3 illustrates the functional blocks of the filter in a specific implementation. Those functional blocks can be implemented in various ways. According to one example, these functional blocks are implemented using dedicated circuitry. According to another example, the filter is implemented using hardware and software. For example, the filter includes a microcontroller and software running on the microcontroller. Consequently, the storing means 22 may include any kind of storage configured to store a digital value. According to one example, the storing means (as well as all of the storing means disclosed herein) includes a memory element, such as a register. This register may be implemented, for example, using digital register elements known in the art such as flip-flops, although other register types could be used. The storing means may also include other types of memory, including, but not limited to, SRAM memory or DRAM memory. Further, the output circuit 3 is not necessarily a dedicated electronic circuit, but may be realized by circuitry of the microcontroller.

Referring to FIG. 3, an adder 21 adds each incoming input signal value x[k] to the integration value currently stored in the storing means 22, wherein a result of this operation is received at an input 23 of the storing means 22 and is used to update the integration value stored in the storing means 22. Thus, each integration value y[k] stored in the storing means 22 and available at the output of the storing means is given by:

$$y[k]=y[k-1]+x[k],$$

that is, each integration value y[k] is given by the integration value y[k−1] previously stored in the storing means 22 plus an instantaneous signal value x[k] of the input signal. According to one example, x[1] denotes a first signal value received by the filter 1 and the integration value (start value) stored in the storing means 22 before the first signal value x[0] is received is zero. In this case, the first integration value y[1] is given by the first signal value, y[1]=x[1]. A second integration value y[2] is given by y[2]=x[2]+y[1]=x[2]+x[1], and so on.

Referring to FIG. 3, the reset circuit 4 is connected to a reset input 25 of the storing means 22. The reset circuit 4 is configured to reset the storing means 22 each time the predefined number N1 of input signal values x[k] have been received by the integrator 2 and integrated (summed up). Resetting the storing means includes setting the value stored in the storing means to a predefined value such as zero (0). According to one example, the reset circuit 4 receives a clock signal CLK that defines the sampling frequency of the input signal x[k], counts the predefined number N1 of clock cycles, and resets the storing means 22 each time N1 clock cycles have lapsed. According to another example, the reset circuit 4 receives the input signal x[k], counts the predefined number N1 of signal values x[k] received by the integrator 2 and resets the storing means 22 each time N1 input signal values x[k] have been received. In the first case, the reset circuit 4 may additionally receive a start signal from a controller (not shown). The start signal may include information about the start of the input signal x[k] or may be a signal that instructs the filter 1 to start operation. The controller, for example, may initiate the generation of the input signal x[k]. In the second case, the reset circuit may obtain information about the start of the input signal x[k] from the input signal itself.

Each time the reset circuit 4 resets the storing means 22 a new integration sequence starts, wherein in each integration sequence the predefined number N1 of input signal values x[k] are integrated. In the following, a sequence of N1 input signal values that are integrated before the storing means 22 is reset is referred to as integration sequence.

Figure 4:
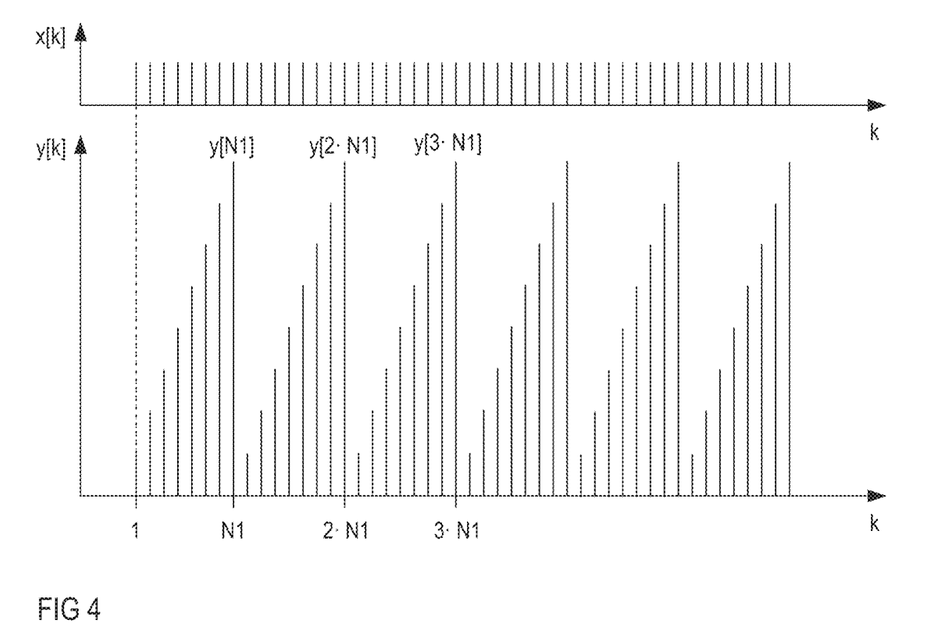
FIG. 4 shows signal waveforms that illustrate a function of an integrator and a reset circuit in the filter according to FIG. 3.

The function of the integrator 2 and the reset circuit 4 is illustrated in FIG. 4 that illustrates one example of a successive input signal values x[k] and the corresponding integration values y[k]. Just for the purpose of illustration, it is assumed that the input signal x[k] includes identical signal values x[k] so that the signal values of each integration sequence are identical and the integration values y[k] are incrementally increased each time a new input signal value x[k] is received, wherein the increment is given by the constant input signal value x[k]. In reality, of course, the input signal values x[k] are not identical. In fact, the input signal x[k] may include a low-frequency desired signal that is superimposed by a high-frequency noise signal. The integration performed by the integrator 2 has a low-pass filtering effect so that the noise signal is at least partially suppressed.

Referring to FIG. 4, an integration value y[k] is output by the storing means 22 each time an input signal value x[k] is received, so that each value of the input signal x[k] has a corresponding integration value y[k]. Referring to the above, the storing means 22 is reset by the reset circuit 4 each time a sequence with the predefined number N1 of the input signal values x[k] has been received by the integrator 2. The last integration value before the storing means 22 is reset represents the sum of the input signal values x[k] included in the respective integration sequence. These last integration values are referred to as y[N1], y[2·N1], y [3·N1] in FIG. 4. In general, the integration value y[k] can be expressed dependent on values of the input signal x[k] as follows:

$$y[k]=\Sigma_{i=k-j}^{k}x[i], \text{ where } j=(k-1)\bmod N1 \qquad (2).$$

Referring to FIG. 3, the output circuit 3 receives the integration values y[k] and generates the output signal $z[k_{DEC}]$ based on these integration values y[k]. In the following, $z[k_{DEC}]$ is used to denote both the output signal and signal values of the output signal.

The output circuit 3 operates in a steady operating mode after the predefined number N1 of input signal values x[k] have been received after the start of the input signal x[k], that is, after the storing means 22 has been reset for the first time. In the steady operating mode, the output circuit outputs the last integration values (see y[N1], y[2·N1], y [3·N1] in FIG. 4), that is the integration values that represent the sum of the input signal values x[k] included in the individual integration sequences. In general, in the steady operating mode, the output signal values $z[k_{DEC}]$ are given by $$z[k_{DEC}]=y[k_{DEC}\cdot N1] \qquad (3a).$$

Equation (3a) represents an ideal case and does not consider possible delays between providing the integration values y[k] by the storing means 22 and generating the output signal $z[k_{DEC}]$. More generally, $$z[k_{DEC}]=y[k_{DEC}\cdot N1+\Sigma] \qquad (3b),$$

where τ denotes a delay between providing the integration values y[k] by the storing means 22 and generating the output signal $z[k_{DEC}]$. This delay may be caused by processing the integration values y[k] in the output circuit 3.

In the initial operating mode, the output circuit 3 outputs at least one of the integration values y[1] ... y[N1−1] output by the storing means 22 during the very first integration sequence of input signal values x[k]. The "very first integration sequence" includes the signal values of the input signal immediately after the start of the input signal x[k] or after the filter is enabled to start integrating the input signal x[k]. According to one example, the input signal x[k] starts when a signal value different from a predefined initial signal value (for example, zero) occurs after the input signal x[k] had the initial signal value for more than a predefined time period. In this case, the filter 1, based on the input signal x[k] decides when to start operation, that is, when the very first integration sequence starts. According to another example, a controller such as the controller mentioned above, instructs the filter 1 to start operation. In this case, the controller defines the beginning of the very first integration sequence, wherein the input signal x[k] may have signal values that are different from zero already before the beginning of the very first integration sequence. This signal values, however, may not be processed by the filter 1.

Figure 5:
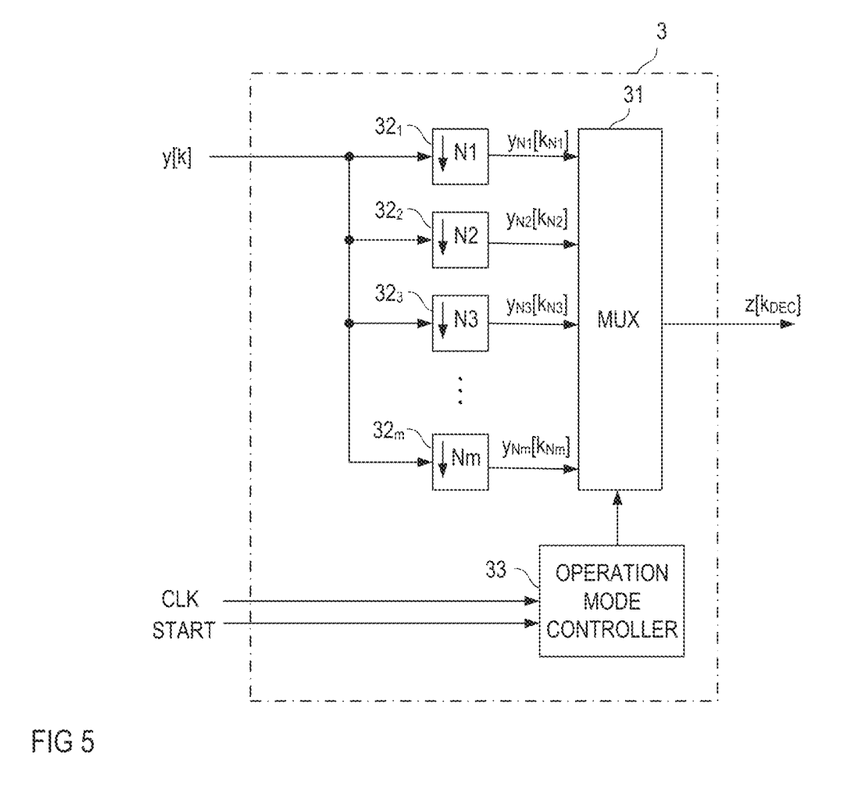
FIG. 5 illustrates one example of an output circuit of the low-pass filter shown in FIG. 3.

One example of an output circuit 3 configured to operate either in the initial operating mode or the steady operating mode is illustrated in FIG. 5. The output circuit 3 according to FIG. 5 includes a first downsampling circuit $32_1$ and at least one further downsampling circuit $32_2$-$32_m$, wherein in the example illustrated in FIG. 5, the output circuit 3 includes three further downsampling circuits $32_2$-$32_m$. This, however, is only an example. The number of further downsampling circuits $32_2$-$32_m$ is arbitrary. Each of the first downsampling circuit $32_1$ and the at least one further downsampling circuit $32_2$-$32_m$ receives the integration values y[k]. Each of the downsampling circuits $32_1$, $32_2$, $32_3$, $32_m$ generates a downsampled signal $y_{N1}[k_{N1}]$, $y_{N2}[k_{N2}]$, $y_{N3}[k_{N3}]$, $y_{Nm}[k_{Nm}]$ by downsampling the sequence of integration values y[k]. In the following, $y_{N1}[k_{N1}]$-$y_{Nm}[k_{Nm}]$ are used to denote both output signals of the downsampling circuits $32_1$-$32_m$ and signal values of these output signals. It has to be noted that the principle functionality of the proposed filter 1 is also valid if further downsampling stages are included before/after filter 1 and/or from the output of integrator 2 to the input of output circuit 3.

Each of the downsampling circuits $32_1$-$32_m$ has a downsampling factor, wherein the downsampling factor of the first downsampling circuit $32_1$ equals the predefined number N1 and downsampling factors N2, N3, Nm of the further downsampling circuits $32_2$-$32_m$ are smaller than the predefined number N1. Each of the downsampling circuits $32_1$ is configured to sample each Ni-th integration value of the sequence of integration values y[k] and outputs the sampled signal value (wherein $32_i$ represents an arbitrary one of the downsampling circuits $32_1$-$32_m$ and Ni represents the downsampling factor associated with the respective downsampling circuit $32_i$). Sampling frequencies of the output signals $y_{Ni}[k_{Ni}]$ of the downsampling circuits $32_i$ are smaller than the sampling frequency of the integrator output signal y[k]. Further, because of the different downsampling factors N2, N3, Nm the sampling frequencies of the output signals $y_{Ni}[k_{Ni}]$ of the downsampling circuits $32i$ are different (so that different discrete time variables $k_{N2}$, $k_{N3}$, $k_{Nm}$ are used). In general, the sampling frequency of one of these signals $y_{Ni}[k_{Ni}]$ is 1/Ni times the sampling frequency of the input signal x[k] and output signal values $y_{Ni}[k_{Ni}]$ of the downsampling circuits $32_i$ are given by $$y_{Ni}[k_{Ni}]=y[k_{Ni}\cdot Ni+\tau_i] \qquad (4),$$

where $\tau_i$ denotes a delay of the i-th downsampling circuit. A multiplexer 31 receives the output signals $y_{Ni}[k_{Ni}]$ from the individual downsampling circuits $32_i$ and generates the output signal $z[k_{DEC}]$ based on these downsampled signals $y_{Ni}[k_{Ni}]$. The multiplexer 31 is controlled by an operation mode controller 33, wherein the operation mode controller 33 is configured to control the multiplexer 31 such that in the steady operating mode, the output signal $y_{N1}[k_{N1}]$ of the first downsampling circuit $32_1$ is output as the output signal $z[k_{DEC}]$. That is, $z[k_{DEC}]=y_{N1}[k_{N1}]$ in the steady operating mode. Thus, in the steady operating mode, the sampling frequency of the output signal $z[k_{DEC}]$ is 1/N1 times the sampling frequency of the input signal x[k].

In the initial operating mode, the operation mode controller controls the multiplexer 31 such that the downsampled signal $y_{N2}[k_{N2}]-y_{Nm}[k_{Nm}]$ generated by one of the further downsampling circuits $32_2$-$32_m$ is output as the output signal $z[k_{DEC}]$.

The operation mode controller 33 causes the output circuit 3 by suitably controlling the multiplexer 31 to operate in the steady operating mode or the initial operating mode. According to one example, the operation mode controller 33 receives the clock signal CLK that defines the sampling frequency of the input signal x[k] and a start signal START. The start signal either includes information about when the input signal x[k] starts or is the signal that instructs the output circuit 3 to start operation. After being instructed by the start signal START to start operation, the operation mode controller 33 counts clock cycles of the clock signal and causes the output circuit 3 to operate in the steady operating mode or the initial operating mode. More specifically, the operating mode controller 33 operates the output circuit 3 in the initial operating mode during the predefined number N1 of clock cycles after start, and in the steady operating mode afterwards. Alternatively, the operation mode controller 33 receives the input signal x[k], detects the beginning of the input signal x[k], counts the signal values of the input signal x[k] and causes the output circuit 3 to operate in the steady operating mode or the initial operating mode.

The operation mode controller 33 may operate the output circuit in the steady operating mode by causing the multiplexer 31 to output the downsampled signal $y_{N1}[k_{N1}]$ of the first downsampling circuit $32_1$ as the output signal $z[k_{DEC}]$ after the N1 input signal values x[k] have been received. Equivalently, the operation mode controller 33 may operate the output circuit 3 in the initial operating mode when the output circuit 3 is instructed to start operation or when a very first signal value of the input signal x[k] is received by the filter 1 and until the predefined number N1 of signal values have been received. Operating the output circuit 3 in the initial operating mode includes causing the multiplexer 31 to output the output signal $y_{N2}[k_{N2}]-y_{Nm}[k_{Nm}]$ of one of the further downsampling circuits $32_i$ as the output signal $z[k_{DEC}]$.

Referring to the above, the downsampling factors N2, N3, Nm of the further downsampling circuits $32_2$, $32_3$, $32_m$ are smaller than the downsampling factor N1 of the first downsampling circuit $32_1$. Thus, after the start of the input signal x[k] or after the filter 1 starts to operate, a respective first value of the output signals $y_{N2}[k_{N2}]-y_{Nm}[k_{Nm}]$ of each of the further downsampling circuits $32_2$-$32_m$ is obtained before a first signal value of the output signal $y_{N1}[k_{N1}]$ of the first downsampling circuit $32_1$ is obtained. In general, a first value of the output signal $y_{Ni}[k_{Ni}]$ of an arbitrary one of the further downsampling circuits $32_i$ is obtained after Ni, wherein Ni<N1, input signal values x[k] have been received by the filter 1. Ni corresponds to the second predefined number mentioned above. A delay time between the start of the input signal x[k] or the start of operation of the filter 1 and the time instance when a first signal value of the output signal $z[k_{DEC}]$ is provided is given by $(Ni-1)/f_{CLK}$, which is shorter than $(N1-1)/f_{CLK}$ in the conventional method.

A filter 1 of the type illustrated in FIG. 3 is, in particular, suitable to filter an input signal that has a low-frequency signal component and a superimposed high-frequency (noise) signal component. The filter suppresses the high-frequency signal component by integrating the input signal values x[k]. In this case, the greater the predefined number N1, the better the high-frequency signal component is suppressed and the more accurately the output signal $z[k_{DEC}]$ represents the low-frequency signal component. In the initial operating mode, the integration sequences are shorter than in the steady operating mode, that is, a first signal value of the output signal $z[k_{DEC}]$ is based on only Ni input signal values x[k] (wherein i=2 . . . m) instead of Ni input signal values x[k] in the steady operating mode. Thus, the at least one signal value $z[k_{DEC}]$ of the output signal that are provided in the initial operating mode might be less accurate than the signal values $z[k_{DEC}]$ of the output signal in the steady operating mode. Nevertheless, the at least one signal value provided in the initial operating mode provides a good first approximation at a reduced delay time.

According to one example, in the initial operating mode, the operation mode controller 33 controls the multiplexer such that only one of the output signals $y_{N2}[k_{N2}]-y_{Nm}[k_{Nm}]$ of the further downsampling circuits $32_2$-$32_m$ is output as the output signal $z[k_{DEC}]$. In this case, the operation mode controller may select the one of the further downsampling circuits $32_2$-$32_m$ based on predefined criteria such as the duration of an acceptable delay time.

According to another example, in the initial operating mode, the operation mode controller 33 controls the multiplexer such that successively two or more of the output signals $y_{N2}[k_{N2}]-y_{Nm}[k_{Nm}]$ of the further downsampling circuits $32_2$-$32_m$ are output as the output signal $z[k_{DEC}]$. If for example, Nm<N3<N2, the operation mode controller may control the multiplexer 31 such (a) that the output signal $y_{Nm}[k_{Nm}]$ of downsampling circuit $32_m$ is output as the output signal $z[k_{DEC}]$ after Nm signal values of the input signal x[k] have been received;

(b) that the output signal $y_{N3}[k_{N3}]$ of the downsampling circuit $32_3$ is output as the output signal $z[k_{DEC}]$ after N3 signal values of the input signal x[k] have been received; and (c) that the output signal $y_{N2}[k_{N2}]$ of the downsampling circuit $32_2$ is output as the output signal $z[k_{DEC}]$ after N2 signal values of the input signal x[k] have been received.

In this way, a first signal value of the output signal $z[k_{DEC}]$ is provided after Nm input signal values x[k] have been received by the filter 1, an updated signal value is provided after N3 input signal values x[k] have been received by the filter 1, and another updated signal value is provided after N2 input signal values x[k] have been received by the filter 1, wherein the accuracy increases with each updated signal value as the number of input signal values x[k] on which the respective updated signal value is based increases.

Figure 6:
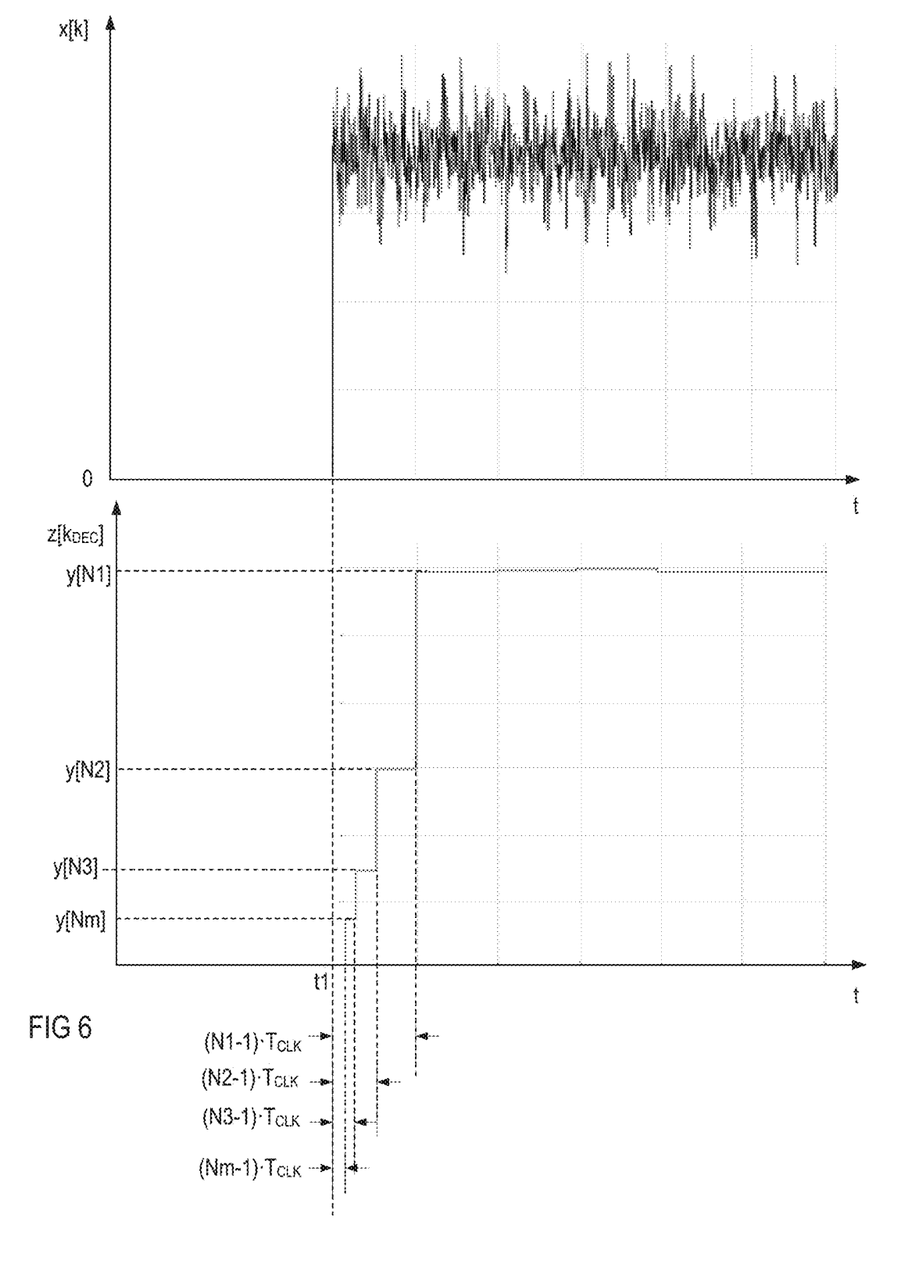
FIG. 6 shows signal waveforms that illustrate the function of the filter when implemented with an output circuit as shown in FIG. 5.

FIG. 6 shows a signal diagram of one example of the input signal x[k] and the corresponding output signal $z[k_{DEC}]$ generated in the way explained above. Referring to FIG. 6, a first signal value of the output signal $z[k_{DEC}]$ is generated after Nm input signal values x[k]. This first signal value is given by y[Nm] and the associated delay time is $Nm/f_{CLK}$. An updated signal value y[N3] is generated after N3 input signal values x[k], wherein the associated delay time is N3/$f_{CLK}$, and so on. The filter enters the steady operating mode when N1 input signal values x[k] have been received and the output signal $y_{N1}[k_{N1}]$ of the first downsampling circuit $32_1$ is output as the output signal z[$k_{DEC}$].

The first predefined number N1 and the second predefined numbers N2-Nm can be arbitrary. The first predefined number N1 may be selected such that, based on an expected frequency of the high-frequency component that is to be filtered out, a satisfying filtering result is obtained. The second predefined numbers N2-Nm may be selected suitably to reduce the waiting time until a first output signal value is generated. According to one example, the first predefined number N1 is a power of 2, so that N1=$2^n$, wherein n is an integer greater than 3. Further, each of N2, N3, Nm is a power of 2, that is each of N2, N3, Nm can be expressed as $2^p$, wherein 1<p<n. For example, N1=256 (=$2^8$), N2=128 (=$2^7$), N3=64 (=$2^6$) and N2=32 (=$2^5$).

In the example illustrated in FIG. 6, the output signal values z[$k_{DEC}$], in the initial operating mode, simply corresponds to the output signal $y_{Ni}[k_{Ni}]$ of one of the further downsampling circuits $32_i$, where i=2 . . . m, wherein this output signal essentially equals the sum of Ni input signal values. As Ni is different for the downsampling circuits $32_i$, the output signal Z[$k_{DEC}$] increase with each update in the initial operating mode (even when the low-frequency signal component of the input signal x[k] does not change). This may be undesirable and can be prevented by multiplying the output signal $y_{N2}[k_{N2}]$-$y_{Nm}[k_{Nm}]$ of each of the further downsampling circuits $32_2$-$32_m$ with a respective scaling factor s2, s3, sm by a respective scaling circuit $34_2$-$34_m$. According to one example, these scaling factors are proportional to the predefined number N1 and inversely proportional to the scaling factor of the respective further downsampling circuit $32_2$-$32_m$. According to one example, si=N1/Ni, wherein si is an arbitrary one of the scaling factors s2-sm and Ni is the downsampling factor of the respective downsampling circuit $32_i$. FIG. 8 shows a signal diagram of the output signal z[$k_{DEC}$] that is obtained by an output circuit 3 according to FIG. 7.

Scaling operations performed by the scaling circuit may include bit shifting or bit discarding operations and do not necessarily include multipliers. Assume, for example, that each of the signal values of the downsampled signals $y_{N2}[k_{N2}]$-$y_{Nm}[k_{Nm}]$ is represented by a digital word including a number of u bits. Assume, further, that the scaling factor, which is denoted as si, is given by si=$2^v$. In this case, scaling the downsampled signal value that is represented by the data word with u bits can be obtained by discarding v least significant bits in case of a negative v or adding v least significant bits in case of a positive v. Similar can be achieved by bit shift operations in software, hence, a left shift operation in case of a positive v and a right shift operation in case of a negative v. Furthermore, a bit shift about 0 bits or discarding 0 bits, i.e., si=$2^v$=$2^o$, is considered scaling by a factor of 1, and is inherently in the scope of s0, s1, s2, s3, or sm in FIG. 7.

Figure 7:
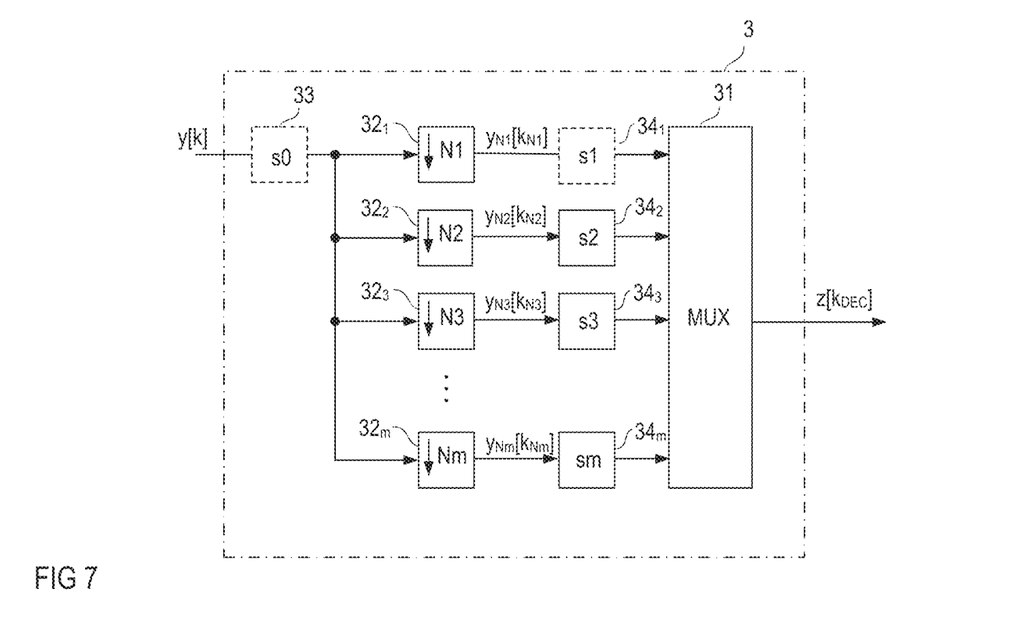
FIG. 7 illustrates another example of the output circuit of the filter shown in FIG. 3.
Figure 8:
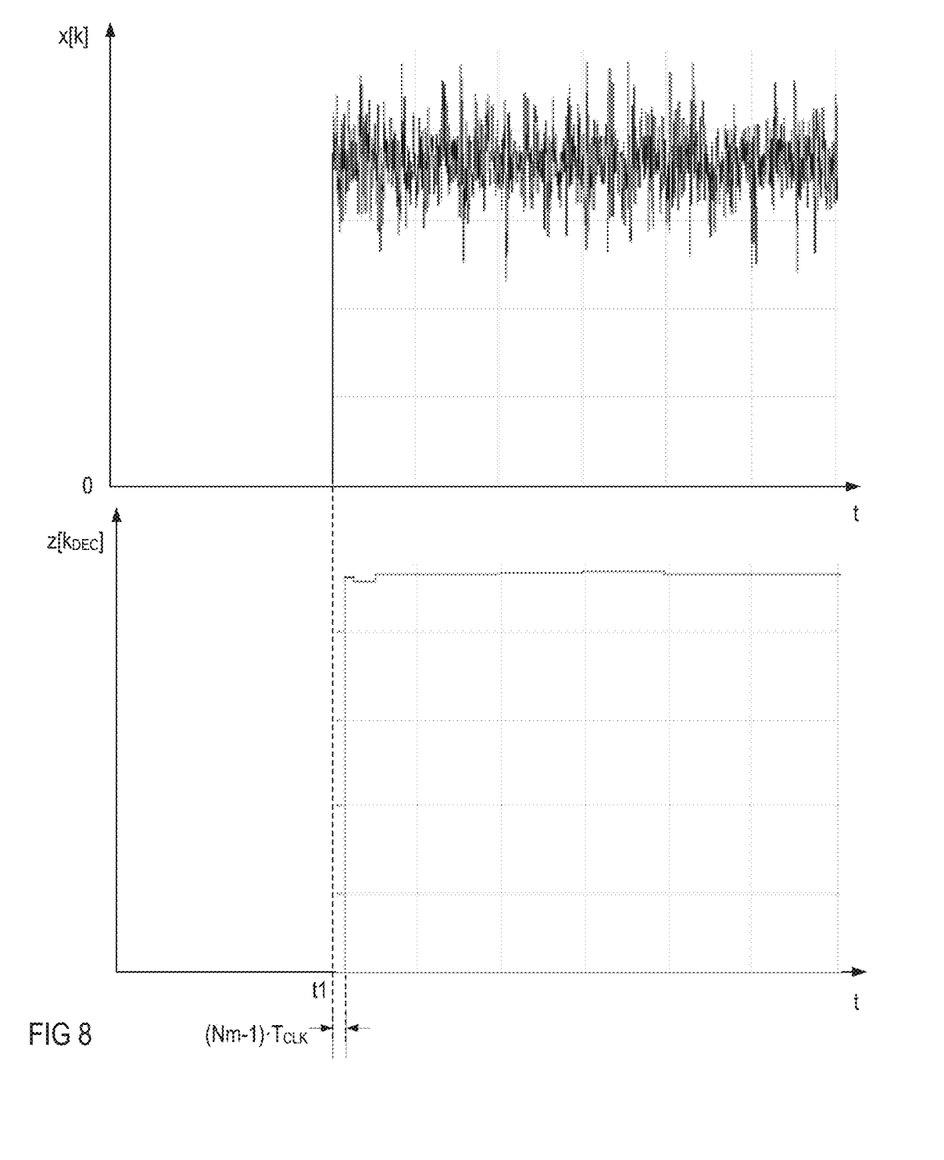
FIG. 8 shows signal waveforms that illustrate the function of the low-pass filter when implemented with an output circuit as shown in FIG. 7.

According to one example, which is illustrated in dashed lines in FIG. 7, the output signal of the first downsampling circuit $34_1$ is scaled by a first scaling factor s1. In this case, the scaling factors s2-sm of the further downsampling circuits $34_2$-$34_m$ are adapted to the first scaling factor s1 such that $$si = s1 \cdot \frac{N1}{Ni}.$$

In each of the examples illustrated in FIGS. 5 and 7, the integration values y[k] may be multiplied with an arbitrary scaling factor s0 (33) by means of a multiplier, bit shift operations or bit adding/discarding, so that the downsampling circuits $32_1$-$32_m$ receive scaled versions of the integration values y[k]. The scaling factor s0 may be chosen equal 1/N1, 1/Ni or any other number, so that the corresponding further scaling factors s1-sm are chosen in a way to fulfil a total downsampling path scaling of 1/N1 for $32_1$, 1/N2 for $32_2$, 1/N3 for $32_3$, and so on. Choosing the scaling factors to achieve bigger or smaller downsampling path scaling, e.g. for meeting (output) bit width requirements, does not violate this principle. The downsampling path starts at the integrator output 24 and ends at the filter output 12.

Figure 9:
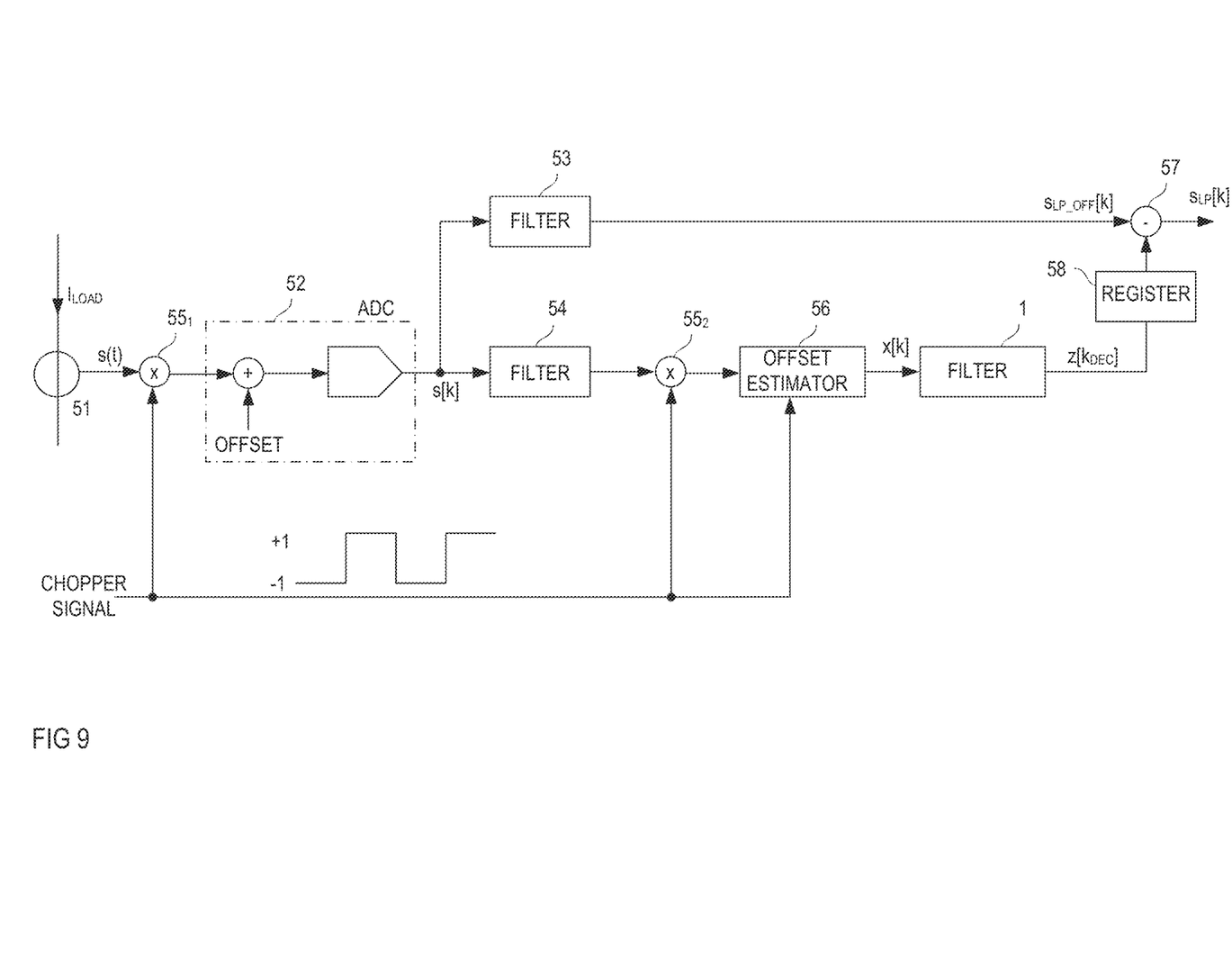
FIG. 9 illustrates using a filter of the type illustrated in FIG. 3 for determining an offset in a current measurement circuit.

FIG. 9 illustrates one example of a current measurement circuit in which a filter 1 of the type explained herein before is implemented. The current measurement circuit includes an analog current sensor 51 that is configured to sense a load current $I_{LOAD}$ in a conductor and generate an analog current measurement signal s(t) that represents the load current $I_{LOAD}$. The current sensor 51 can be any type of analog current sensor such as a sensor including a shunt resistor, a Hall sensor, or the like. The current measurement signal s(t) may include a high-frequency noise signal that may be introduced by the sensor. It is therefore desirable to low-pass filter the current measurement signal s(t) and provide a low-pass filtered discrete current measurement signal at an output of the current measurement circuit. For this, the current measurement circuit includes an analog-to-digital converter (ADC) that receives the analog input signal and provides a discrete (digital) version of the analog current measurement signal s(t). A first low-pass filter 53 receives the discrete current measurement signal s[k] and provides a low-pass filtered current measurement signal $s_{LP\_OFF}[k]$. The first filter 53 can be any kind of digital low-pass filter.

Inevitably, the ADC introduces an offset, so that the discrete current measurement signal s[k] and, consequently, the low-pass filtered current measurement signal $s_{LP\_OFF}[k]$ includes an offset. This offset may falsify the measurement result so that it is desirable to compensate for this offset. The current measurement circuit therefore includes an offset compensation circuit that provides an estimate of the offset and subtracts this estimate from the output signal $s_{LP\_OFF}[k]$ of the first filter 53 by a subtractor 57 in order to provide the low-pass filtered current measurement output signal $s_{LP}[k]$. In the example illustrated in FIG. 9, the filter 1 is part of the offset compensation circuit and the output signal z[$k_{DEC}$] of the filter 1 of the represents an estimate of the offset.

Referring to FIG. 9, the offset compensation circuit includes a second low-pass filter that receives the discrete current measurement signal s[k] and an offset estimator 56 downstream the second low-pass filter. The second filter 54 can be any kind of digital low-pass filter. The offset estimator uses a chopping method to estimate the offset. In this case, the analog current measurement signal is multiplied with a chopper signal which alternatingly changes between −1 and +1 by a first multiplier. The chopping operation introduced by the first multiplier is reversed by a second multiplier $55_2$ connected downstream the second filter 54. As the offset signal is introduced after the analog current measurement signal s(t) has been multiplied with the chopper signal the second multiplier $55_2$ reverses the chopping operation with regard to a signal component resulting from the analog current measurement signal s(t) but not with regard to the offset. An output signal of the second multiplier therefore includes a signal component that is a low-pass filtered version of the analog current measurement signal s(t)

and a second signal component that corresponds to the offset multiplied with the chopper signal. The offset estimator 56 receives the output signal of the second multiplier $55_2$ and the chopper signal and is configured to provide an estimate of the offset based on these signals. This estimate, however, may still include noise so that a further low-pass filtering by the filter 1 is required.

Referring to the above, estimating the offset using the second filter and the offset estimator 56 involves multiplying the analog input signal s(t) and the output signal of the second filter 54 with a chopper signal. This chopping operation, in particular, multiplying the analog input signal s(t) with the chopper signal, would make the output signal $s_{LP\_OFF}$ of the first filter useless unless further measures are taken. According to one example, a further multiplier (not shown) equivalent to the second multiplier is connected downstream the first filter 53. According to another example, the first filter 53 and the offset estimator 56 operate alternatingly. That is, there is one or more time periods when the offset estimator 56 is in operation and the chopping signal is active (that is, alternates between −1 and +1), and there is one or more time periods in which the first filter 53 is in operation and the chopping signal is inactive (has a constant signal level of +1). The estimated offset that is represented by the output signal $z[k_{DEC}]$ of the filter 1 is stored in a storing means 58 such as a register so that it is available at the subtractor in those time periods in which the first filter 53 is active.

Although the present disclosure is not so limited, the following numbered examples demonstrate one or more aspects of the disclosure.

Example 1

A method, including: integrating values of an input signal by an integrator including a storing means; storing an integration value in the storing means; cyclically resetting the storing means after integrating a first predefined number of values of the input signal; in a steady operating mode, generating a value of an output signal based on the integration value stored in the storing means each time after integrating the first predefined number of values of the input signal; and in an initial operating mode, generating an initial value of the output signal based on the integration value stored in the storing means after integrating a second predefined number of values of the input signal, wherein the second predefined number is smaller than the first predefined number.

Example 2

The method of example 1, wherein generating the initial value of the output signal includes generating two or more initial values of the output signal.

Example 3

The method of example 2, wherein each of the two or more initial values of the output signal is generated after integrating the second predefined number of values of the input signal, wherein the second predefined number is different for each of the two or more initial values of the output signal.

Example 4

The method of any one of the preceding examples, wherein the first predefined number is 2n, wherein n is an integer greater than 3.

Example 5

The method of example 4, wherein n is selected from between 4 and 10.

Example 6

The method of example 3, wherein the first predefined number is $2^n$, wherein n is an integer greater than 3, and wherein the second predefined number is $2^p$, wherein p is an integer and 1<p<n.

Example 7

The method of any one of examples 1 to 6, wherein generating the initial value of the output signal based on a respective integration value stored in the storing means includes: generating the initial value of the output signal such that it is equal to the respective integration value stored in the storing means.

Example 8

The method of any one of examples 1 to 6, wherein generating the initial value of the output signal based on a respective integration value stored in the storing means includes: generating the initial value of the output signal such that it is equal to the respective integration value stored in the storing means multiplied with a respective scaling factor.

Example 9

The method of any one of the preceding examples, further including: downsampling a sequence of integration values provided by the integrator using a first downsampling factor in order to provide a first downsampled signal; downsampling the sequence of integration values using at least one further downsampling factor in order to provide at least one further downsampled signal; in the steady operating mode, outputting the first downsampled signal as the output signal; and in the initial operating mode, outputting the at least one further downsampled signal as the output signal.

Example 10

The method of example 9, wherein the first downsampling factor is greater than the at least one further downsampling factor.

Example 11

A filter, including: an integrator including a storing means and configured to successively integrate values of an input signal and store an integration value in the storing means; a reset circuit configured to reset the storing means after integrating a first predefined number of values of the input signal; and an output circuit coupled to the storing means, wherein the output circuit is configured: in a steady operating mode, to generate a value of an output signal based on the integration value stored in the storing means each time after integrating the first predefined number of values of the input signal; and in an initial operating mode, to generate an initial value of the output signal based on the integration value stored in the storing means after integrating a second predefined number of values of the input signal, wherein the second predefined number is smaller than the first predefined number.

Example 12

The filter of example 11, wherein the output circuit is configured to generate two or more initial values of the output signal.

Example 13

The filter of example 12, wherein the output circuit is configured to generate each of the two or more initial values of the output signal after integrating the second predefined number of values of the input signal, wherein the second predefined number is different for each of the two or more initial values of the output signal.

Example 14

The filter of any one of examples 11 to 13, wherein the first predefined number is 2n, wherein n is an integer greater than 3.

Example 15

The filter of example 14, wherein n is selected from between 5 and 9.

Example 16

The filter of example 13, wherein the first predefined number is $2^n$, wherein n is an integer greater than 3, and wherein the second predefined number is $2^m$, wherein m is an integer and 1<m≤n.

Example 17

The filter of any one of examples 11 to 16, wherein the output circuit is configured to generate the initial value of the output signal based on a respective integration value stored in the storing means by generating the initial value of the output signal such that it is equal to the respective integration value stored in the storing means.

Example 18

The filter of any one of examples 11 to 16, wherein the output circuit is configured to generate the initial value of the output signal based on a respective integration value stored in the storing means by generating the initial value of the output signal such that it is equal to the respective integration value stored in the storing means multiplied with a respective scaling factor.

Example 19

The filter of any one of examples 11 to 16, wherein the output circuit includes a first downsampling circuit and at least one further downsampling circuit each being configured to receive a sequence of integration values stored in the storing means, and wherein the output circuit is further configured: in the steady operating mode, to output an output signal of the first downsampling circuit as the output signal, and in the initial operating mode, to output an output signal of the at least one further downsampling circuit as the output signal.

Example 20

The filter of example 19, wherein a downsampling factor of the first downsampling circuit is greater than a downsampling factor of the at least one further downsampling circuit.

While the invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:
1. A method, comprising:
   integrating values of an input signal by an integrator comprising a memory;
   storing an integration value in the memory;
   cyclically resetting the memory after integrating a first predefined number of values of the input signal;
   in a steady operating mode, generating a value of an output signal based on the integration value stored in the memory each time after integrating the first predefined number of values of the input signal; and
   in an initial operating mode, generating an initial value of the output signal based on the integration value stored in the memory after integrating a second predefined number of values of the input signal, wherein the second predefined number is smaller than the first predefined number.
2. The method of claim 1, wherein generating the initial value of the output signal comprises generating two or more initial values of the output signal.
3. The method of claim 2,
   wherein each of the two or more initial values of the output signal is generated after integrating the second predefined number of values of the input signal,
   wherein the second predefined number is different for each of the two or more initial values of the output signal.
4. The method of claim 3,
   wherein the first predefined number is $2^n$, wherein n is an integer greater than 3, and
   wherein the second predefined number is $2^p$, wherein p is an integer and 1<p<n.
5. The method of claim 1, wherein the first predefined number is $2^n$, wherein n is an integer greater than 3.
6. The method of claim 5, wherein n is selected from between 4 and 10.
7. The method of claim 1, wherein generating the initial value of the output signal based on a respective integration value stored in the memory comprises:
   generating the initial value of the output signal such that it is equal to the respective integration value stored in the memory.
8. The method of claim 1, wherein generating the initial value of the output signal based on a respective integration value stored in the memory comprises:
   generating the initial value of the output signal such that it is equal to the respective integration value stored in the memory multiplied with a respective scaling factor.

9. The method of claim 1, further comprising:
- downsampling a sequence of integration values provided by the integrator using a first downsampling factor in order to provide a first downsampled signal;
- downsampling the sequence of integration values using at least one further downsampling factor in order to provide at least one further downsampled signal;
- in the steady operating mode, outputting the first downsampled signal as the output signal; and
- in the initial operating mode, outputting the at least one further downsampled signal as the output signal.

10. The method of claim 9, wherein the first downsampling factor is greater than the at least one further downsampling factor.

11. A filter, comprising:
- an integrator comprising a memory and configured to successively integrate values of an input signal and store an integration value in the memory;
- a reset circuit configured to reset the memory after integrating a first predefined number of values of the input signal; and
- an output circuit coupled to the memory, wherein the output circuit is configured:
  - in a steady operating mode, to generate a value of an output signal based on the integration value stored in the memory each time after integrating the first predefined number of values of the input signal; and
  - in an initial operating mode, to generate an initial value of the output signal based on the integration value stored in the memory after integrating a second predefined number of values of the input signal, wherein the second predefined number is smaller than the first predefined number.

12. The filter of claim 11, wherein the output circuit is configured to generate two or more initial values of the output signal.

13. The filter of claim 12,
- wherein the output circuit is configured to generate each of the two or more initial values of the output signal after integrating the second predefined number of values of the input signal,
- wherein the second predefined number is different for each of the two or more initial values of the output signal.

14. The filter of claim 13,
- wherein the first predefined number is $2^n$, wherein n is an integer greater than 3, and
- wherein the second predefined number is $2^m$, wherein m is an integer and $1 < m < n$.

15. The filter of claim 11, wherein the first predefined number is $2^n$, wherein n is an integer greater than 3.

16. The filter of claim 11,
- wherein the output circuit is configured to generate the initial value of the output signal based on a respective integration value stored in the memory by generating the initial value of the output signal such that it is equal to the respective integration value stored in the memory.

17. The filter of claim 11,
- wherein the output circuit is configured to generate the initial value of the output signal based on a respective integration value stored in memory by generating the initial value of the output signal such that it is equal to the respective integration value stored in the memory multiplied with a respective scaling factor.

18. The filter of claim 11,
- wherein the output circuit comprises a first downsampling circuit and at least one further downsampling circuit each being configured to receive a sequence of integration values stored in the memory, and
- wherein the output circuit is further configured:
  - in the steady operating mode, to output an output signal of the first downsampling circuit as the output signal, and
  - in the initial operating mode, to output an output signal of the at least one further downsampling circuit as the output signal.

19. The filter of claim 18, wherein a downsampling factor of the first downsampling circuit is greater than a downsampling factor of the at least one further downsampling circuit.

20. A system comprising:
- an analog-to-digital converter; and
- a filter coupled to an output of the analog-to-digital converter, the filter comprising
  - an integrator comprising a memory and configured to successively integrate values of an input signal and store an integration value in the memory,
  - a reset circuit configured to reset the memory after integrating a first predefined number of values of the input signal, and
  - an output circuit coupled to the memory, wherein the output circuit is configured:
    - in a steady operating mode, to generate a value of an output signal based on the integration value stored in the memory each time after integrating the first predefined number of values of the input signal, and
    - in an initial operating mode, to generate an initial value of the output signal based on the integration value stored in the memory after integrating a second predefined number of values of the input signal, wherein the second predefined number is smaller than the first predefined number.

* * * * *